US 8,212,598 B2

(12) United States Patent
Michiyoshi

(10) Patent No.: US 8,212,598 B2
(45) Date of Patent: Jul. 3, 2012

(54) OSCILLATION FREQUENCY CONTROL CIRCUIT, DC-DC CONVERTER INCLUDING THE OSCILLATION FREQUENCY CONTROL CIRCUIT, AND SEMICONDUCTOR DEVICE

(75) Inventor: Takashi Michiyoshi, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 152 days.

(21) Appl. No.: 12/810,456

(22) PCT Filed: Dec. 5, 2008

(86) PCT No.: PCT/JP2008/072598
§ 371 (c)(1),
(2), (4) Date: Jun. 24, 2010

(87) PCT Pub. No.: WO2009/087853
PCT Pub. Date: Jul. 16, 2009

(65) Prior Publication Data
US 2010/0277356 A1 Nov. 4, 2010

(30) Foreign Application Priority Data
Jan. 9, 2008 (JP) ................................. 2008-002272

(51) Int. Cl.
*H03L 7/06* (2006.01)
(52) U.S. Cl. .................................... 327/156; 327/147
(58) Field of Classification Search ................. 327/147, 327/156
See application file for complete search history.

(56) References Cited

U.S. PATENT DOCUMENTS

| 5,259,007 A * | 11/1993 | Yamamoto | 375/376 |
|---|---|---|---|
| 6,295,328 B1 * | 9/2001 | Kim et al. | 375/376 |
| 6,867,627 B1 * | 3/2005 | Murtagh | 327/158 |
| 7,239,188 B1 * | 7/2007 | Xu et al. | 327/156 |
| 8,107,580 B2 * | 1/2012 | Harrison | 375/374 |
| 2004/0028242 A1 | 2/2004 | Kitamura | |
| 2007/0230718 A1 | 10/2007 | Oda | |

FOREIGN PATENT DOCUMENTS

| JP | 4-277934 | 10/1992 |
|---|---|---|
| JP | 9-266424 | 10/1997 |
| JP | 2002-76903 | 3/2002 |
| JP | 2002-223132 | 8/2002 |
| JP | 2004-128662 | 4/2004 |
| JP | 2006-262121 | 9/2006 |
| JP | 2007-274812 | 10/2007 |

OTHER PUBLICATIONS

International Search Report in PCT/JP2008/072598.

* cited by examiner

*Primary Examiner* — Lincoln Donovan
*Assistant Examiner* — Adam Houston
(74) *Attorney, Agent, or Firm* — Cooper & Dunham LLP

(57) ABSTRACT

An oscillation frequency control circuit controls a second oscillation circuit, which generates and outputs a second clock signal of a second frequency according to a received control signal, to control the second frequency. The oscillation frequency control circuit includes a frequency difference detection circuit unit configured to detect a difference between a predetermined first frequency of a first clock signal generated by an external first oscillation circuit and the second frequency, and generate and output an output signal indicating a detection result, and a frequency control circuit unit configured to control, according to the output signal of the frequency difference detection circuit unit, the second oscillation circuit to control the second frequency of the second clock signal to make an absolute value of the difference between the first frequency and the second frequency greater than a predetermined value.

20 Claims, 9 Drawing Sheets

OSCILLATION FREQUENCY CONTROL CIRCUIT, DC-DC CONVERTER INCLUDING THE OSCILLATION FREQUENCY CONTROL CIRCUIT, AND SEMICONDUCTOR DEVICE

TECHNICAL FIELD

The present invention generally relates to a digital audio circuit; a DC-DC converter including a switching regulator for feeding power to the digital audio circuit; and a semiconductor device including the DC-DC converter; and particularly relates to an oscillation frequency control circuit for use in the DC-DC converter.

BACKGROUND ART

As a technique relating to digital audio circuits and their power supply circuits, Japanese Patent Laid-Open Publication No. 2002-223132, for example, discloses an audio reproducing apparatus that includes a control loop for detecting fluctuation of supply voltage of a power amplifier and feeding back the results to a switching regulator and a control loop for feeding forward a PWM signal to control the power amplifier. The audio reproducing apparatus effectively controls the fluctuation of the supply voltage by performing not only feedback control but also feedforward control.

Japanese Patent Laid-Open Publication No. 2004-128662, for example, discloses a digital amplifier that includes a constant voltage power supply circuit for supplying power to an output amplification stage, and a modulation circuit for comparing a PCM multibit digital audio input signal with an output signal of the output amplification stage and modulating the output of the constant voltage power supply circuit based on the comparison results. The digital amplifier reduces distortion caused by the output amplification stage.

However, although these related-art techniques correct fluctuation of the output voltage from the power supply circuit according to the audio output, the frequency of a switching clock signal of a switching regulator of a DC-DC converter used in the power supply circuit is not taken into account.

Japanese Patent Laid-Open Publication No. 9-266424, for example, discloses a technique that changes the voltage of power to be supplied to an amplification circuit, and makes a basic wave component and a harmonic component of noise due to switching of a switching regulator used in a power supply have frequencies different from frequencies of a signal tuned by a tuner unit and a signal obtained by the tuner unit, thereby reducing influence of noise. This technique takes into account the noise in the tuner unit, but no measure is taken against noise in an audio circuit.

FIG. 8 is a block diagram illustrating an exemplary related-art digital audio system.

The digital audio system of FIG. 8 includes a digital audio circuit 101, a DC-DC converter 102 as a power supply circuit, and a speaker SP.

The digital audio circuit 101 includes a first oscillation circuit 111, a digital filter 112, a ΔΣ modulator 113, a D/A converter 114, and an output amplifier 115. The DC-DC converter 102 includes a second oscillation circuit 121 and a control circuit 122.

The DC-DC converter 102 is a power supply of each circuit of the digital audio circuit 101, and outputs an output voltage Vdd generated from an input voltage Vin. The first oscillation circuit 111 outputs a first clock signal CLKA to the D/A converter 114, whereby the first clock signal CLKA is used for D/A conversion. The second oscillation circuit 121 outputs a second clock signal CLKB to the control circuit 122, whereby the second clock signal is used for on/off control of a switch element (not shown) of the control circuit 122.

FIG. 9 is a diagram illustrating exemplary frequency components of noise generated in the output amplifier 115.

As shown in FIG. 9, when the frequency of the first clock signal CLKA output from the first oscillation circuit 111 is 2 MHz and the frequency of the second clock signal CLKB output from the second oscillation circuit 121 is 2.001 MHz, large noise components are generated at 2 MHz, which is the frequency of the first clock signal CLKA, and at 2.001 MHz, which is the frequency of the second clock signal CLKB. A noise component is also generated at 1 kHz, which is the difference between 2 MHz and 2.001 MHz.

The human audible frequency range is considered to be from 20 Hz to 20 kHz. That is, the noise at 2 MHz and 2.001 MHz is not audible to human ears and therefore is not a problem, but the noise at 1 kHz can be heard.

Usually, a circuit such as a crystal oscillation circuit that has very stable oscillation frequency is used as the first oscillation circuit 111 of the D/A converter 114. On the other hand, an inexpensive CR oscillation circuit is often used as the second oscillation circuit 121 of the DC-DC converter 102. The CR oscillation circuit has a frequency that tends to fluctuate in response to changes in drive voltage and temperature and has significant manufacturing variations. Therefore, in the case where the frequency of the first clock signal CLKA is close to the frequency of the second clock signal CLKB, when the absolute value of the difference between the frequencies of the first clock signal CLKA and the second clock signal CLKB is equal to or less than the highest frequency (20 kHz) in the audible frequency range, as mentioned above, the output amplifier 115 outputs a noise signal in the audible frequency range, which can be heard as noise.

DISCLOSURE OF THE INVENTION

In view of the foregoing, the present invention is directed toward providing an oscillation frequency control circuit capable of removing a noise signal in an audible frequency range due to the frequency difference between a first clock signal used in a digital audio circuit and a second clock signal used in a DC-DC converter; a DC-DC converter including the oscillation frequency control circuit; and a semiconductor device including the oscillation frequency control circuit.

According to an aspect of the present invention, there is provided an oscillation frequency control circuit that controls a second oscillation circuit, which generates and outputs a second clock signal of a second frequency according to a received control signal, to control the second frequency. The oscillation frequency control circuit includes a frequency difference detection circuit unit configured to detect a difference between a predetermined first frequency of a first clock signal generated by an external first oscillation circuit and the second frequency, and generate and output an output signal indicating a detection result; and a frequency control circuit unit configured to control, according to the output signal of the frequency difference detection circuit unit, the second oscillation circuit to control the second frequency of the second clock signal to make an absolute value of the difference between the first frequency and the second frequency greater than a predetermined value.

According to another aspect of the present invention, there is provided a DC-DC converter having a switching power supply circuit. The DC-DC converter includes a second oscillation circuit configured to generate and output a second clock signal of a second frequency according to a received control signal; a control circuit configured to perform switching control on a switch element of the switching power supply circuit according to the clock signal output from the second oscillation circuit, convert an applied voltage into a predetermined constant voltage, and output the predetermined constant voltage; and an oscillation frequency control circuit configured to control the second oscillation circuit to control a second frequency of the second clock signal. The oscillation frequency control circuit includes a frequency difference detection circuit unit configured to detect a difference between a predetermined first frequency of a first clock signal generated by an external first oscillation circuit and the second frequency, and generate and output an output signal indicating a detection result; and a frequency control circuit unit configured to control, according to the output signal of the frequency difference detection circuit unit, the second oscillation circuit to control the second frequency of the second clock signal to make an absolute value of the difference between the first frequency and the second frequency greater than a predetermined value.

According to still another aspect of the present invention, there is provided a semiconductor device that includes a digital audio circuit configured to convert a received digital signal into an analog audio signal and a DC-DC converter having a switching power supply circuit. The semiconductor device includes a first oscillation circuit configured to generate and output a first clock signal of a first frequency to be used for the D/A conversion, a second oscillation circuit configured to generate and output a second clock signal of a second frequency to be used for performing switching control on a switch element of the switching power supply circuit, and an oscillation frequency control circuit configured to control the second oscillation circuit to control the second frequency of the second clock signal. The oscillation frequency control circuit includes a frequency difference detection circuit unit configured to detect a difference between a predetermined first frequency of a first clock signal generated by an external first oscillation circuit and the second frequency, and generate and output an output signal indicating a detection result; and a frequency control circuit unit configured to control, according to the output signal of the frequency difference detection circuit unit, the second oscillation circuit to control the second frequency of the second clock signal to make an absolute value of the difference between the first frequency and the second frequency greater than a predetermined value.

According to the above-described oscillation frequency control circuit, DC-DC converter, and semiconductor device, when the frequency difference between the first clock signal and the second clock signal falls in the audible frequency range, the second frequency of the second clock signal is changed to prevent the frequency difference from remaining in the audible frequency range. Therefore, in the case where the first clock signal is used in the digital audio circuit and the second clock signal is used in the DC-DC converter, it is possible to remove a noise signal in the audible frequency range due to the frequency difference between the first clock signal and the second clock signal and reduce clock noise superimposed on an output circuit of the digital audio circuit.

Further, when the second frequency of the second clock signal falls into the audible frequency range, the second frequency of the second clock signal is increased to be greater than the highest audible frequency. Therefore, it is possible to reduce clock noise superimposed on the output circuit of the digital audio circuit.

BEST MODE FOR CARRYING OUT THE INVENTION

Exemplary embodiments of the present invention are described below with reference to the accompanying drawings.

First Embodiment

Figure 1:
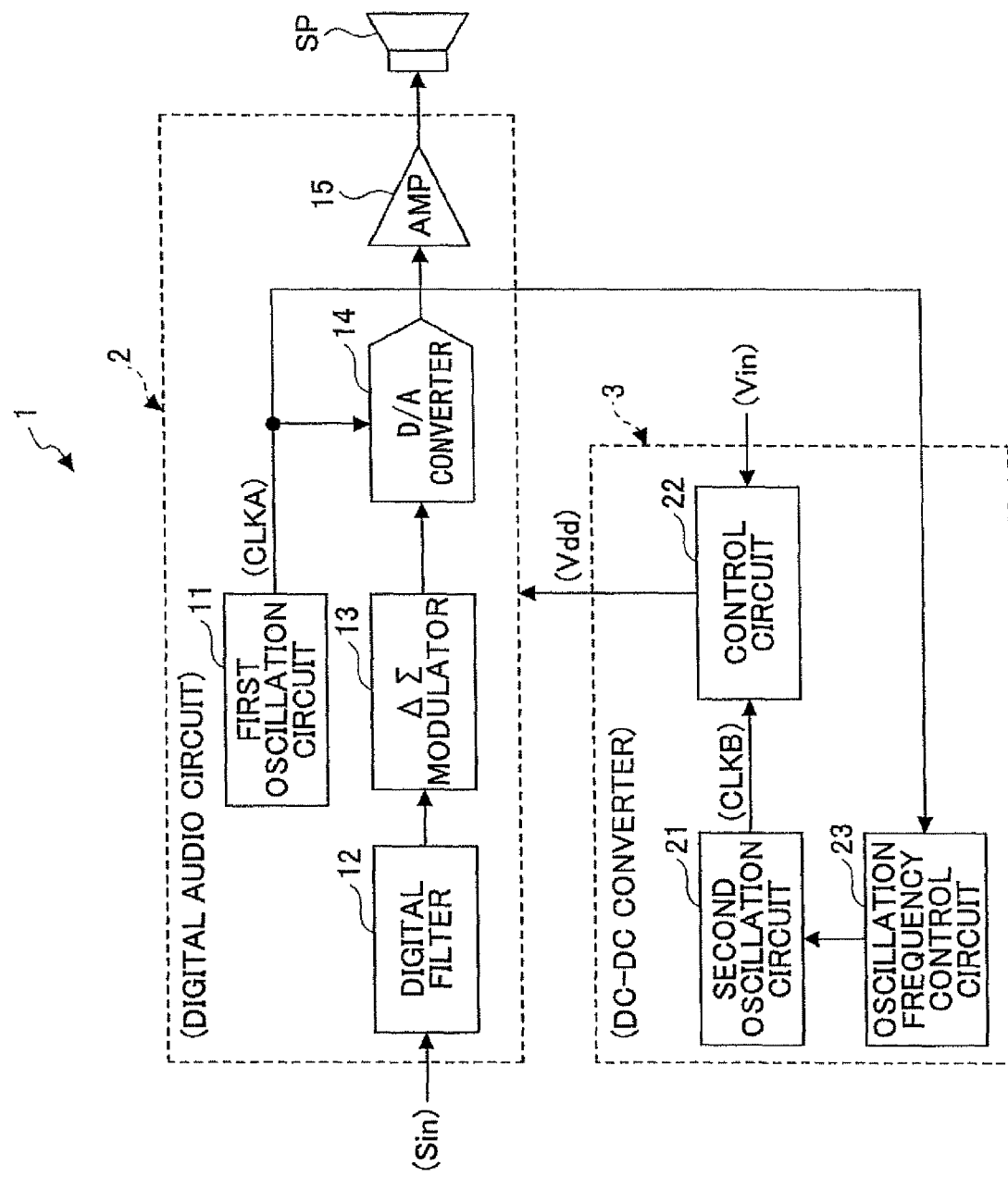
FIG. 1 is a block diagram illustrating an exemplary digital audio system using an oscillation frequency control circuit according to a first embodiment of the present invention.

FIG. 1 is a block diagram illustrating an exemplary digital audio system 1 using an oscillation frequency control circuit 23 according to a first embodiment of the present invention.

The digital audio system 1 of FIG. 1 includes a digital audio circuit 2, a DC-DC converter 3 as a power supply circuit, and a speaker SP.

The digital audio circuit 2 includes a first oscillation circuit 11 for generating a predetermined first clock signal CLKA, a digital filter 12, a ΔΣ modulator 13, a D/A converter 14, and an output amplifier 15. The DC-DC converter 3 includes a second oscillation circuit 21 for generating a second clock signal CLKB, a control circuit 22 to which the second clock signal CLKB is input, and an oscillation frequency control circuit 23 for controlling the oscillation frequency of the second oscillation circuit 21.

A digital input signal Sin is input to the digital audio circuit 2, passes through the digital filter 12 and the ΔΣ modulator 13, and is input to the D/A converter 14. The D/A converter 14 converts the input digital signal into an analog audio signal. The audio signal is amplified by the output amplifier 15 and is converted into sound by the speaker SP.

The first oscillation circuit 11 generates and outputs a first clock signal CLKA of a predetermined first frequency FA. The first clock signal CLKA is input to the D/A converter 14, whereby the first clock signal CLKA is used for D/A conversion.

The DC-DC converter 3 receives an input voltage Vin, converts the input voltage Vin into a predetermined constant voltage, and supplies the predetermined constant voltage as a supply voltage Vdd to each circuit of the digital audio circuit 2. As mentioned above, the first clock signal CLKA, which is output from the first oscillation circuit 11, is input to the D/A converter 14, whereby the first clock signal CLKA is used for D/A conversion. The first clock signal CLKA is also input to the oscillation frequency control circuit 23. The second clock signal CLKB, which is output from the second oscillation circuit 21, is input to the control circuit 22, whereby the second clock signal CLKB is used for on/off control of a switch element (not shown) of the control circuit 22. The control circuit 22 converts the input voltage Vin into the predetermined constant voltage to generate the supply voltage Vdd using the received second clock signal CLKB.

Figure 2:
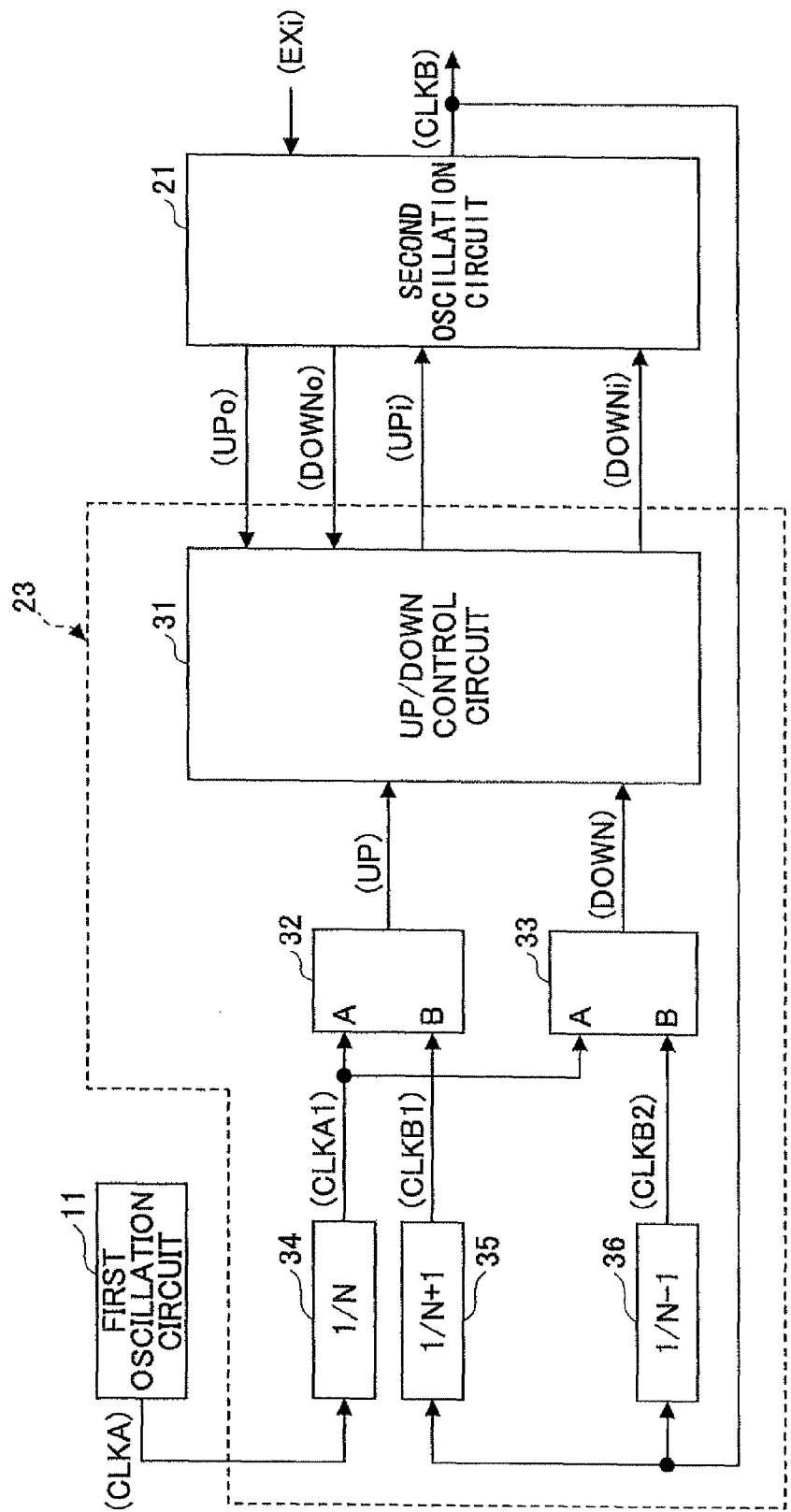
FIG. 2 is a block diagram illustrating an exemplary oscillation frequency control circuit according to the first embodiment of the present invention.

FIG. 2 is a block diagram illustrating an exemplary configuration of the oscillation frequency control circuit 23 of FIG. 1 according to the first embodiment of the present invention.

In FIG. 2, the oscillation frequency control circuit 23 includes an up/down control circuit 31, a first frequency comparison circuit 32, a second frequency comparison circuit 33, a first frequency divider circuit 34, a second frequency divider circuit 35, and a third frequency divider circuit 36. The up/down control circuit 31 forms a frequency control circuit unit. The first frequency comparison circuit 32, the second frequency comparison circuit 33, the first frequency divider circuit 34, the second frequency divider circuit 35, and the third frequency divider circuit 36 form a frequency difference detection circuit unit.

The first frequency divider circuit 34 receives the first clock signal CLKA and divides the frequency of the received first clock signal CLKA into 1/N (N is an integer greater than 1) to generate and output a first frequency-divided clock signal CLKA1. The value of N is set to make the frequency of the first frequency-divided clock signal CLKA1 equal to a predetermined frequency, for example, about 20 kHz, which is the highest frequency in the audible frequency range, or slightly greater than the predetermined frequency. If the first frequency FA of the first clock signal CLKA is 2 MHz, N may be set to 100 in order to divide the first frequency FA into a frequency of 20 kHz.

The second frequency divider circuit 35 receives the second clock signal CLKB and divides the frequency of the received second clock signal CLKB into 1/(N+1) to generate and output a second frequency-divided clock signal CLKB1. As noted above, when the first frequency FA of the first clock signal CLKA is 2 MHz, N is equal to 100. Then, the frequency dividing ratio of the second frequency divider circuit 35 is 1/101. That is, when a second frequency FB of the second clock signal CLKB is 2.02 MHz, which is 20 kHz greater than the first frequency signal FA of the first clock signal CLKA, the frequency of the second frequency-divided clock signal CLKB1 is 20 kHz, which is equal to the frequency of the first frequency-divided clock signal CLKA1.

The third frequency divider circuit 36 receives the second clock signal CLKB and divides the frequency of the received second clock signal CLKB into 1/(N−1) to generate and output a third frequency-divided clock signal CLKB2. As noted above, when the first frequency FA of the first clock signal CLKA is 2 MHz, N is equal to 100. Then, the frequency dividing ratio of the third frequency divider circuit 36 is 1/99. That is, when the second frequency FB of the second clock signal CLKB is 1.98 MHz, which is 20 kHz less than the first frequency of the first clock signal CLKA, the frequency of the third frequency-divided clock signal CLKB2 is 20 kHz, which is equal to the frequency of the first frequency-divided clock signal CLKA1.

The first frequency comparison circuit 32 receives the first frequency-divided clock signal CLKA1 and the second frequency-divided clock signal CLKB1, compares the frequencies of the first frequency-divided clock signal CLKA1 and the second frequency-divided clock signal CLKB1, generates an up signal UP indicating the comparison result, and outputs the up signal UP to the up/down control circuit 31. For example, if the frequency of the second frequency-divided clock signal CLKB1 is less than the frequency of the first frequency-divided clock signal CLKA1, the first frequency comparison circuit 32 outputs an up signal UP of high level. On the other hand, if the frequency of the second frequency-divided clock signal CLKB1 is equal to or greater than the frequency of the first frequency-divided clock signal CLKA1, the first frequency comparison circuit 32 outputs an up signal UP of low level.

The second frequency comparison circuit 33 receives the first frequency-divided clock signal CLKA1 and the third frequency-divided clock signal CLKB2, compares the frequencies of the first frequency-divided clock signal CLKA1 and the third frequency-divided clock signal CLKB2, generates a down signal DOWN indicating the comparison result, and outputs the down signal DOWN to the up/down control circuit 31. For example, if the frequency of the third frequency-divided clock signal CLKB2 is greater than the frequency of the first frequency-divided clock signal CLKA1, the second frequency comparison circuit 33 outputs a down signal DOWN of high level. On the other hand, if the frequency of the third frequency-divided clock signal CLKB2 is equal to or less than the frequency of the first frequency-divided clock signal CLKA1, the second frequency comparison circuit 33 outputs a down signal DOWN of low level.

Figure 3:
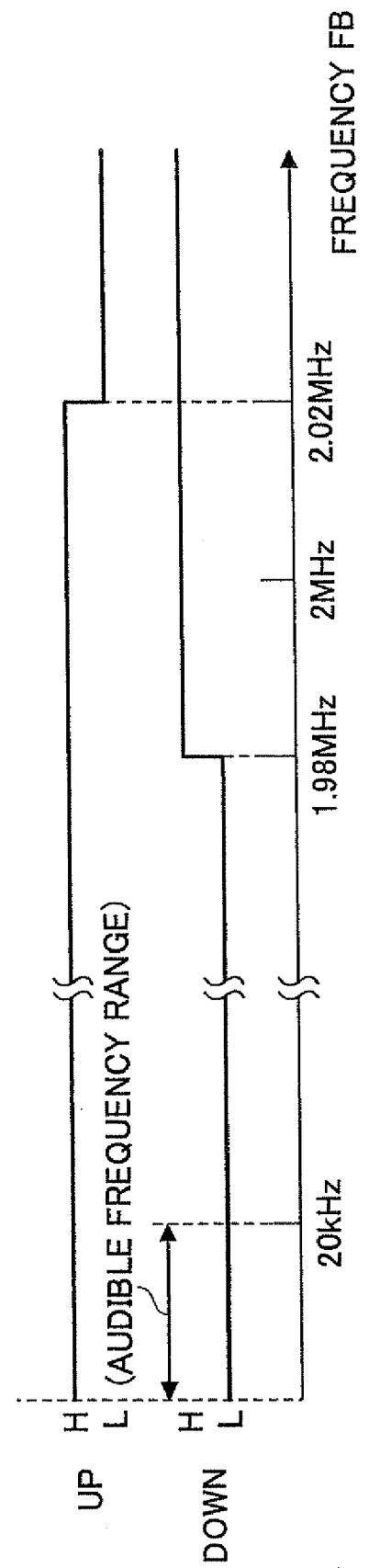
FIG. 3 is a diagram illustrating an exemplary up signal and down signal.

FIG. 3 is a diagram illustrating an exemplary up signal UP and down signal DOWN.

For example, assume that the first frequency FA of the first clock signal CLKA output from the first oscillation circuit 11 is 2 MHz, and the second frequency FB of the second clock signal CLKB output from the second oscillation circuit 21 is 2.03 MHz, which is greater than 2 MHz by 20 kHz or more. Note that the value of N of the frequency dividing ratio of the first frequency divider circuit 34, the second frequency divider circuit 35, and the third frequency divider circuit 36 is set to 100.

Then, the frequency of the first frequency-divided clock signal CLKA1 output from the first frequency divider circuit 34 is 20 kHz, and the frequency of the second frequency-divided clock signal CLKB1 output from the second frequency divider circuit 35 is about 20.1 kHz. Since the frequency of the second frequency-divided clock signal CLKB1 is greater than the frequency of the first frequency-divided clock signal CLKA1, the first frequency comparison circuit 32 outputs an up signal UP of low level.

The frequency of the third frequency-divided clock signal CLKB2 output from the third frequency divider circuit 36 is about 20.5 kHz. Since the frequency of the third frequency-divided clock signal CLKB2 is greater than the frequency of the first frequency-divided clock signal CLKA1, the second frequency comparison circuit 33 outputs a down signal DOWN of high level.

Next, assume that the second frequency FB of the second clock signal CLKB is 2.01 MHz, and the difference between the second frequency FB of the second clock signal CLKB and the first frequency FA of the first clock signal CLKA is equal to or less than 20 kHz. Then, the frequency of the second frequency-divided clock signal CLKB1 is about 19.9 kHz. Since the frequency of the second frequency-divided clock signal CLKB1 is equal to or less than the frequency of the first frequency-divided clock signal CLKA1, the up signal UP output from the first frequency comparison circuit 32 is high. The frequency of the third frequency-divided clock signal CLKB2 is about 20.3 kHz. Since the frequency of the third frequency-divided clock signal CLKB2 is greater than the frequency of the first frequency-divided clock signal CLKA1, the down signal DOWN output from the second frequency comparison circuit 33 is high.

Next, assume that the second frequency FB of the second clock signal CLKB is 1.97 MHz, which is less than the frequency of the first frequency FA of the first clock signal CLKA by 20 kHz or more. Then, the frequency of the second frequency-divided clock signal CLKB1 is about 19.5 kHz. Since the frequency of the second frequency-divided clock signal CLKB1 is equal to or less than the frequency of the first frequency-divided clock signal CLKA1, the up signal UP output from the first frequency comparison circuit 32 is high. The frequency of the third frequency-divided clock signal CLKB2 is about 19.9 kHz. Since the frequency of the third frequency-divided clock signal CLKB2 is less than the frequency of the first frequency-divided clock signal CLKA1, the down signal DOWN output from the second frequency comparison circuit 33 is low.

That is, as shown in FIG. 3, the down signal DOWN becomes low when the second frequency FB of the second clock signal CLKB is equal to or less than a frequency (1.98 MHz in the example) which is less than the first frequency FA of the first clock signal CLKA by the frequency of the first frequency-divided clock signal CLKA1, and becomes high when the second frequency FB of the second clock signal CLKB is greater than this frequency (1.98 MHz). The up signal UP becomes low when the second frequency FB of the second clock signal CLKB is equal to or greater than a frequency (2.02 MHz in the example) which is greater than the first frequency FA of the first clock signal CLKA by the frequency of the first frequency-divided clock signal CLKA1, and becomes high when the second frequency FB of the second clock signal CLKB is less than this frequency (2.02 MHz).

The second oscillation circuit 21 generates and outputs the second clock signal CLKB for controlling a switching transistor (not shown) of the DC-DC converter 3. For example, the DC-DC converter 3 is a PFM (Pulse Frequency Modulation) type that changes the switching frequency depending on the output load conditions, and the second oscillation circuit 21 changes the second frequency FB of the second clock signal CLKB according to an external input signal EXi received from an external device. The second oscillation circuit 21 outputs, other than the second clock signal CLKB, an up output signal UPo and a down output signal DOWNo to the up/down control circuit 31. The up output signal UPo becomes high when the second frequency FB of the second clock signal CLKB is increasing. The down output signal DOWNo becomes high when the second frequency FB is decreasing. When the second frequency FB of the second clock signal CLKB is stable, the second oscillation circuit 21 switches both the up output signal UPo and the down output signal DOWNo to low.

The up/down control circuit 31 generates, according to the received up signal UP and the down signal DOWN, an up control signal UPi and a down control signal DOWNi to make the absolute value of the difference between the first frequency FA of the first clock signal CLKA and the second frequency FB of the second clock signal CLKB greater than a predetermined value, and outputs the up control signal UPi and the down control signal DOWNi to the second oscillation circuit 21. The second oscillation circuit 21 operates to increase the second frequency FB of the second clock signal CLKB regardless of the external input signal EXi when the up control signal UPi is high, and operates to reduce the second frequency FB of the second clock signal CLKB regardless of the external input signal EXi when the down control signal DOWNi is high. When both the up control signal UPi and the down control signal DOWNi are low, the second oscillation circuit 21 controls the second frequency FB of the second clock signal CLKB according to the external input signal EXi.

Figure 4:
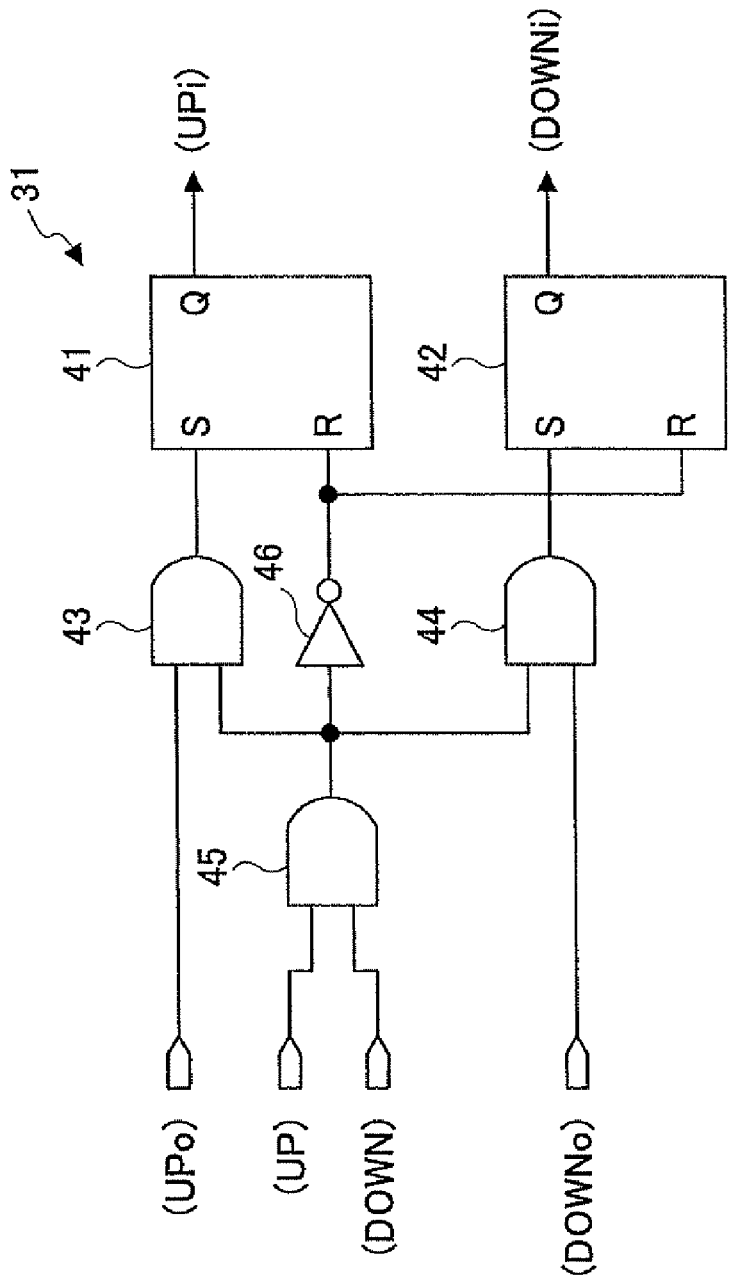
FIG. 4 is a diagram illustrating an exemplary circuit configuration of an up/down control circuit of FIG. 2.

FIG. 4 is a diagram illustrating the up/down control circuit 31 of FIG. 2. Operations of the up/down control circuit 31 are described below in greater detail with reference to FIG. 4.

In FIG. 4, the up/down control circuit includes latch circuits 41 and 42, AND circuits 43-45, and an inverter 46.

The up signal UP is input to an input terminal of the AND circuit 45, and the down signal DOWN is input to the other input terminal of the AND circuit 45. The output terminal of the AND circuit 45 is connected to an input terminal of the AND circuit 43 and an input terminal of the AND circuit 44. The up output signal UPo and the down output signal DOWNo are input to the other input terminal of the AND circuit 43 and the other input terminal of the AND circuit 44, respectively. An output terminal of the AND circuit 43 is connected to a set input terminal S of the latch circuit 41. An output terminal of the AND circuit 44 is connected to a set input terminal S of the latch circuit 42. An output terminal of the inverter 46 is connected to reset input terminals R of the latch circuits 41 and 42. The up control signal UPi and the down control signal DOWNi are output from an output terminal Q of the latch circuit 41 and an output terminal Q of the latch circuit 42, respectively.

Operations for controlling the second frequency FB of the second clock signal CLKB using the up/down control circuit 31 having the above configuration are described. In the following description, the first frequency FA of the first clock signal CLKA is 2 MHz, and N of the first frequency divider circuit 34, the second frequency divider circuit 35, and the third frequency divider circuit 36 is 100.

When the second frequency FB of the second clock signal CLKB is less than 1.98 MHz or greater than 2.02 MHz, one of the up signal UP and the down signal DOWN is low as mentioned above. Under such conditions, since one of the up signal UP and the down signal DOWN applied to the AND circuit 45 is low, the AND circuit 45 outputs an output signal of low level.

The output signal of low level is input to the corresponding input terminals of the AND circuits 43 and 44, and hence the AND circuits 43 and 44 output signals of low level regardless of the received up output signal UPo and down output signal DOWNo, respectively. On the other hand, the inverter 46 outputs an output signal of high level, and hence the latch circuits 41 and 42 are reset. Then, the up control signal UPi and the down control signal DOWNi output from the latch circuits 41 and 42, respectively, become low. That is, both the up control signal UPi and the down control signal DOWNi applied to the second oscillation circuit 21 are low, and hence the second oscillation circuit 21 performs frequency control according to only the external input signal EXi.

When the second frequency FB of the second clock signal CLKB is in the range of 1.98-2.02 MHz and is decreasing, both the up signal UP and the down signal DOWN are high. Then, the output signal of the AND circuit 45 is high and the output signal of the inverter 46 is low. Since the second frequency FB is decreasing, the up output signal UPo is low and the down output signal DOWNo is high. Then, the output signal of the AND circuit 43 is low, and the output signal of the AND circuit 44 is high.

Then, the latch circuit 42 is set, and hence the down control signal DOWNi becomes high and the up control signal UP1 becomes low. Therefore, the second oscillation circuit 21 reduces the second frequency FB of the second clock signal CLKB regardless of the external input signal EXi. When the second frequency FB of the second clock signal CLKB decreases to 1.98 MHz or less, both the up control signal UP1 and the down control signal DOWNi become low as mentioned above, so that the second oscillation circuit 21 controls the second frequency FB according to the external input signal EXi.

When the second frequency FB of the second clock signal CLKB is in the range of 1.98-2.02 MHz and is increasing, both the up signal UP and the down signal DOWN are high. Then, the output signal of the AND circuit 45 is high. Since the second frequency FB is increasing, the up output signal UPo is high and the down output signal DOWNo is low. Then, the output signal of the AND circuit 43 is high; the output signal of the AND circuit 44 is low; and the output signal of the inverter 46 is low.

Then, the latch circuit 41 is set, and hence the up control signal UP1 becomes high and the down control signal DOWNi becomes low. Therefore, the second oscillation circuit 21 increases the second frequency FB regardless of the external input signal EXi.

When the second frequency FB of the second clock signal CLKB increases to 2.02 MHz or greater, both the up control signal UP1 and the down control signal DOWNi become low as mentioned above, so that the second oscillation circuit 21 controls the second frequency FB according to the external input signal EXi.

In this way, when the difference between the second frequency FB of the second clock signal CLKB and the first frequency FA of the first clock signal CLKA becomes equal to or less than the highest audible frequency, the second frequency FB is continuously increased or reduced until the difference between the second frequency FB and the first frequency FA exceeds the highest audible frequency. Therefore, the difference between the second frequency FB and the first frequency FA is prevented from remaining in the audible frequency range, thereby significantly reducing the noise output from the digital audio circuit 2.

Even when the difference between the second frequency FB and the first frequency FA fluctuates in the audible frequency range, since the frequency that appears as noise is distributed across the audible frequency range, the average noise level is reduced to the level that does not cause any practical problem.

Figure 5:
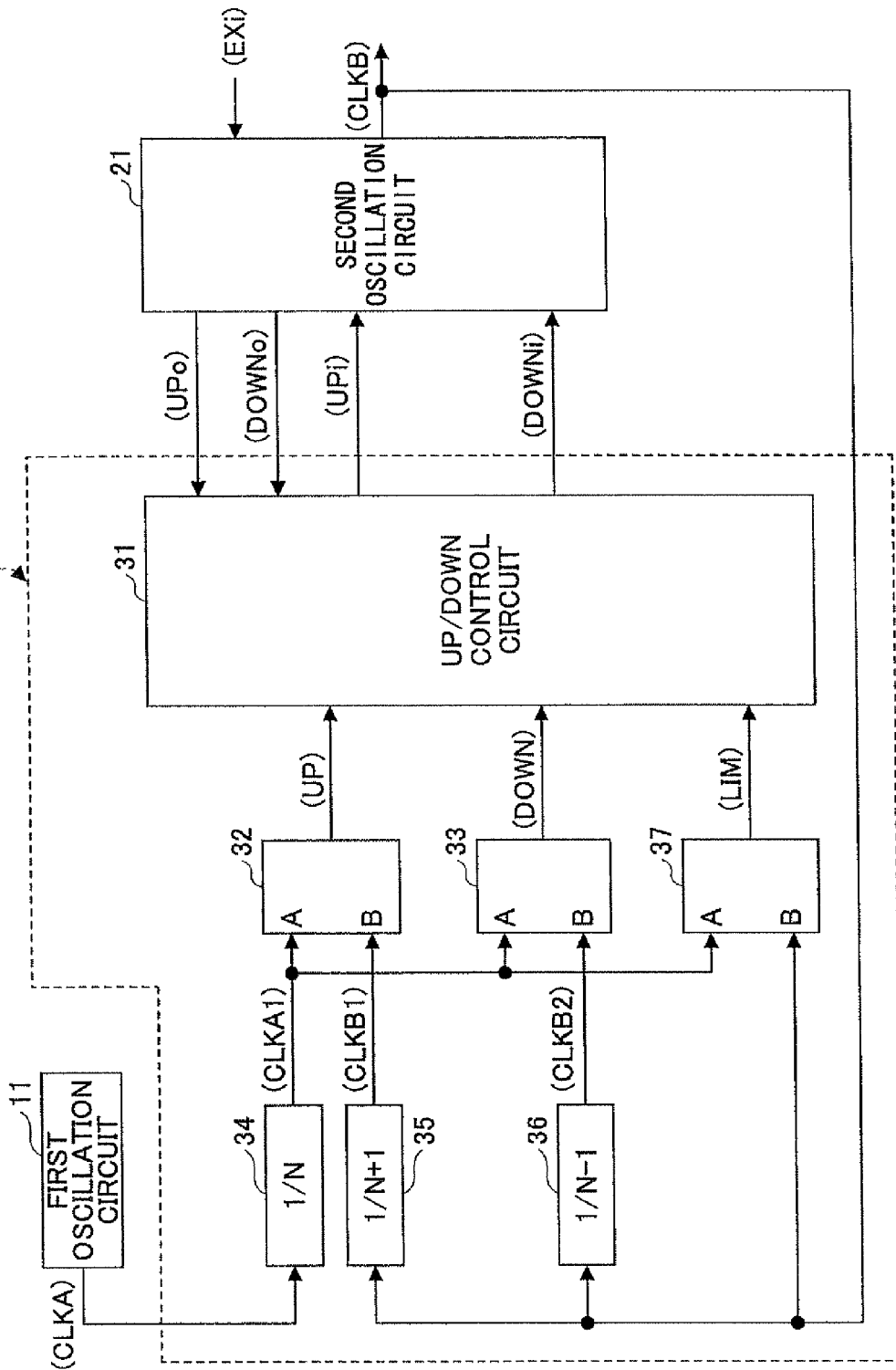
FIG. 5 is a block diagram illustrating another exemplary oscillation frequency control circuit according to the first embodiment of the present invention.

FIG. 5 is a block diagram illustrating another exemplary configuration of the oscillation frequency control circuit 23 of FIG. 1 according to the first embodiment of the present invention. In FIG. 5, components identical to those in FIG. 2 are denoted by the same reference numerals and are not further described. The following describes only the difference from the configuration shown in FIG. 2.

The configuration shown in FIG. 5 is different from the configuration shown in FIG. 2 in that a third frequency comparison circuit 37 is added. The first frequency comparison circuit 32, the second frequency comparison circuit 33, the first frequency divider circuit 34, the second frequency divider circuit 35, the third frequency divider circuit 36, and the third frequency comparison circuit 37 form a frequency difference detection circuit unit.

The third frequency comparison circuit 37 receives the first frequency-divided clock signal CLKA1 and the second clock signal CLKB, compares the frequencies of the first frequency-divided clock signal CLKA1 and the second clock signal CLKB, generates a limit signal LIM indicating the comparison result, and outputs the limit signal LIM to the up/down control circuit 31.

Figure 6:
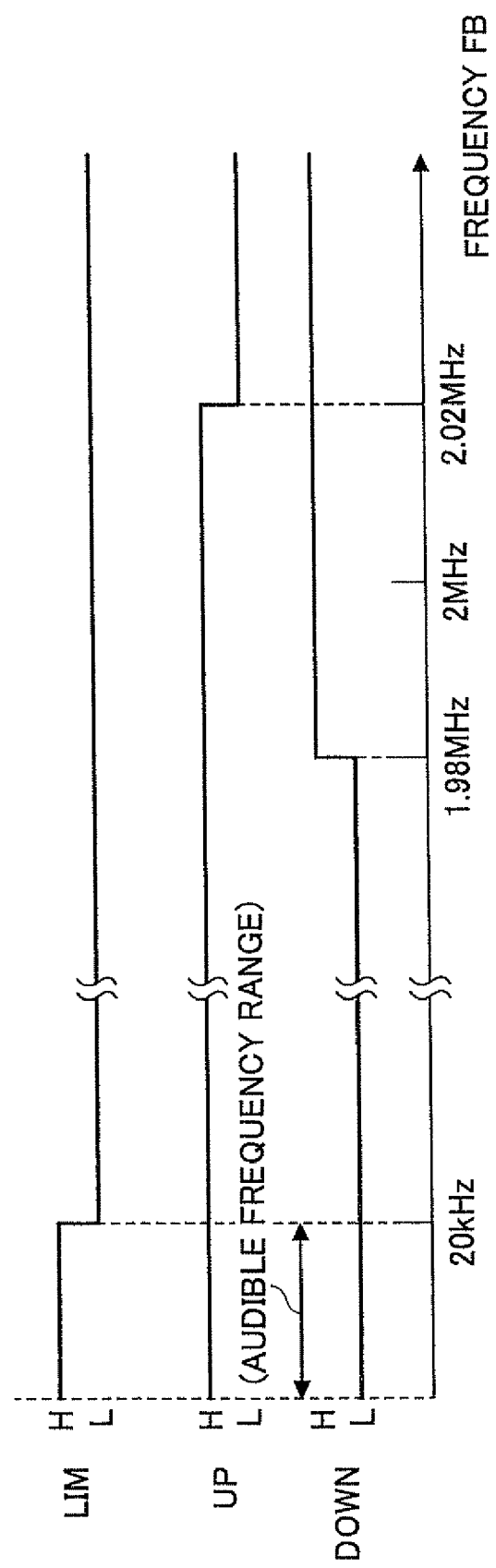
FIG. 6 is a diagram illustrating an exemplary relationship between a limit signal, an up signal, and a down signal of FIG. 5.

FIG. 6 is a diagram illustrating an exemplary relationship between the limit signal LIM, the up signal UP, and the down signal DOWN of FIG. 5, in which the horizontal axis indicates the second frequency FB.

As can be seen from FIG. 6, the third frequency comparison circuit 37 outputs the limit signal LIM of high level when the second frequency FB of the second clock signal CLKB is equal to or less than the highest audible frequency (20 kHz), which is the frequency of the first frequency-divided clock signal CLKA1, and switches the limit signal LIM to low when the second frequency FB of the second clock signal CLKB exceeds the highest audible frequency. If the limit signal LIM of high level is applied to the up/down control circuit 31, the up/down control circuit 31 outputs the up control signal UP1 of high level to the second oscillation circuit 21 instead of generating the up control signal UP1 as described with reference to FIGS. 2 and 4. If the limit signal LIM of low level is applied to the up/down control circuit 31, the up/down control circuit outputs, to the second oscillation circuit 21, the up control signal UP1 that is generated as described with reference to FIGS. 2 and 4.

Figure 7:
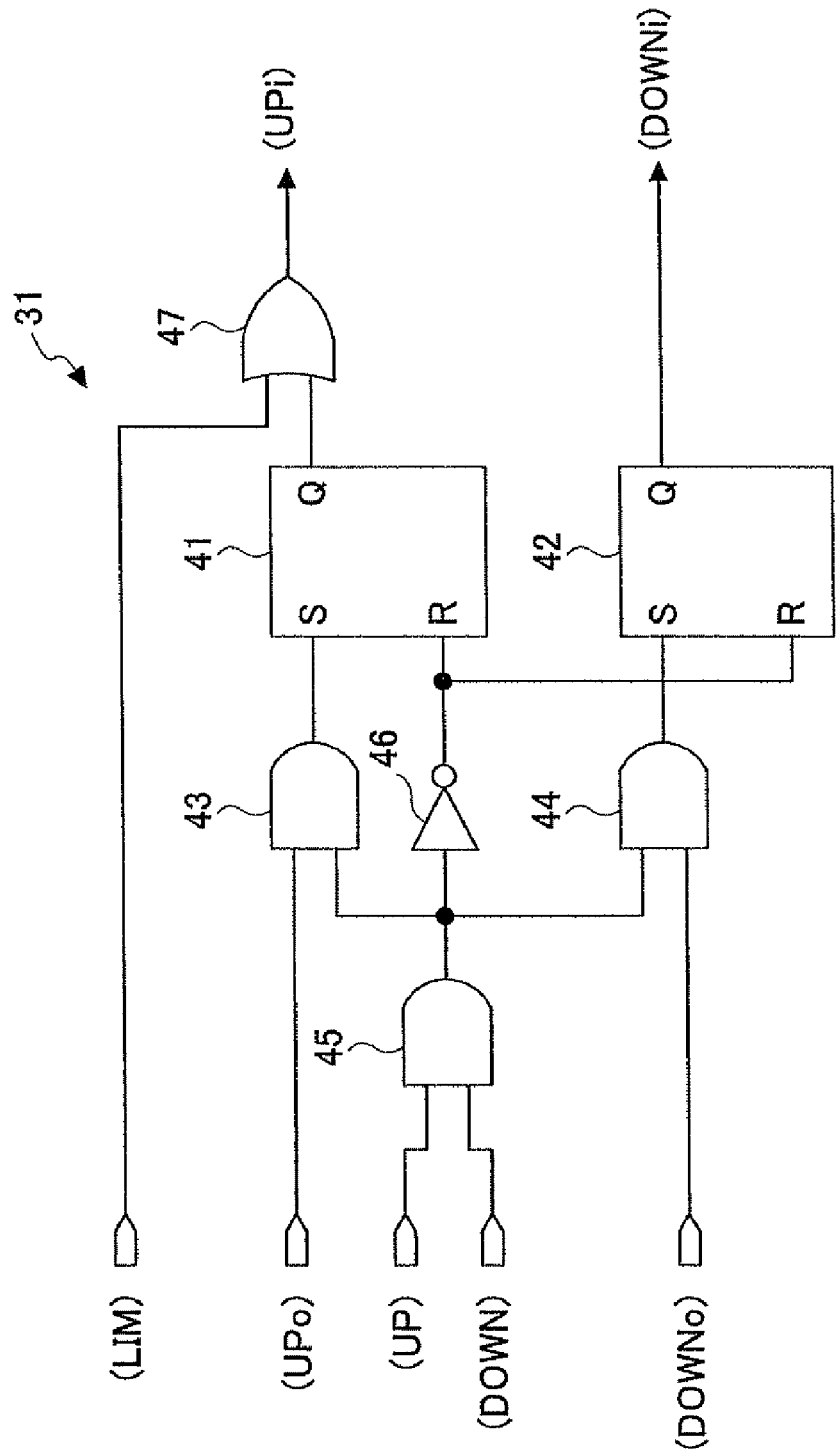
FIG. 7 is a diagram illustrating an exemplary internal circuit configuration of an up/down control circuit of FIG. 5.
Figure 8:
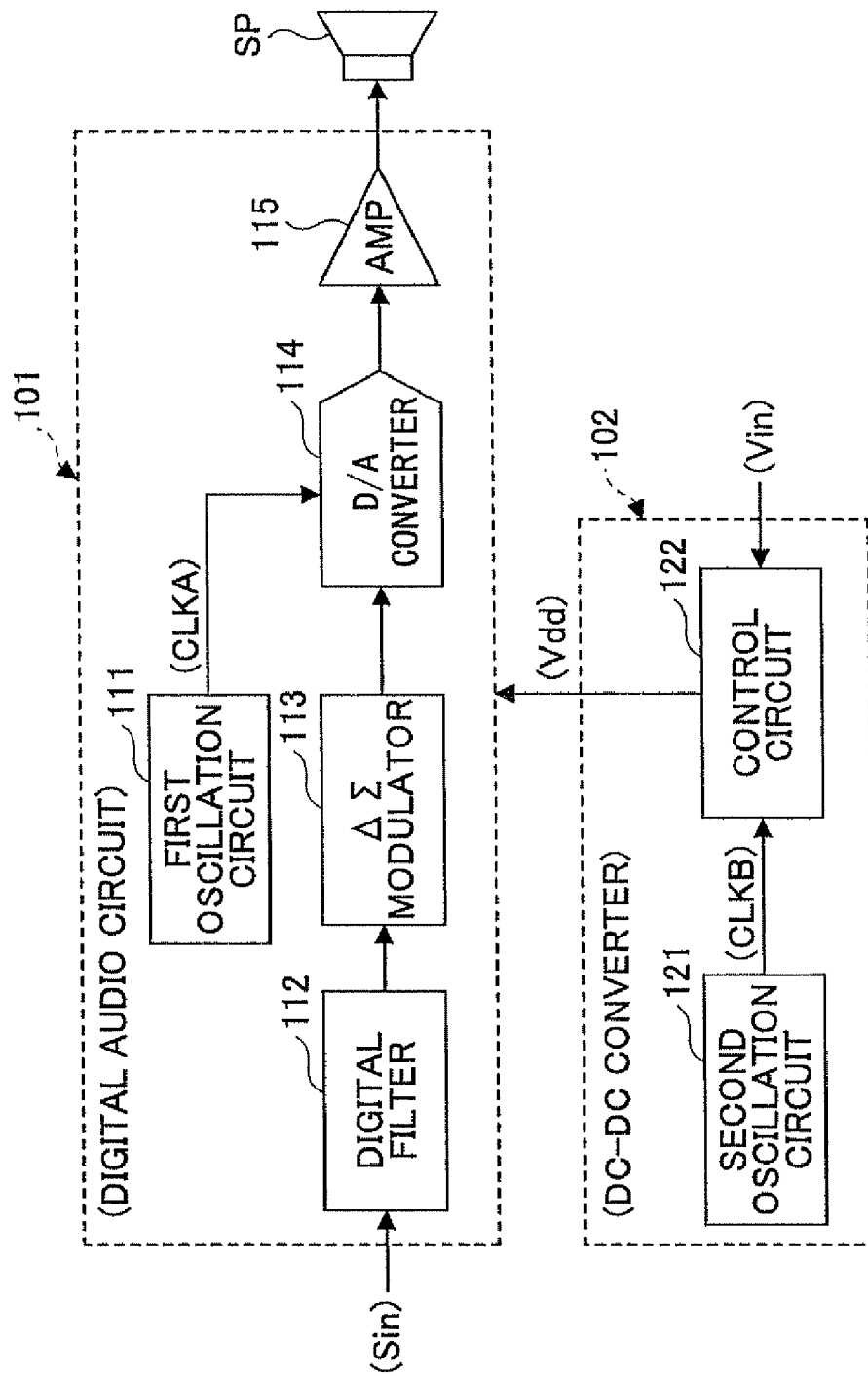
FIG. 8 is a block diagram illustrating an exemplary related-art digital audio system.
Figure 9:
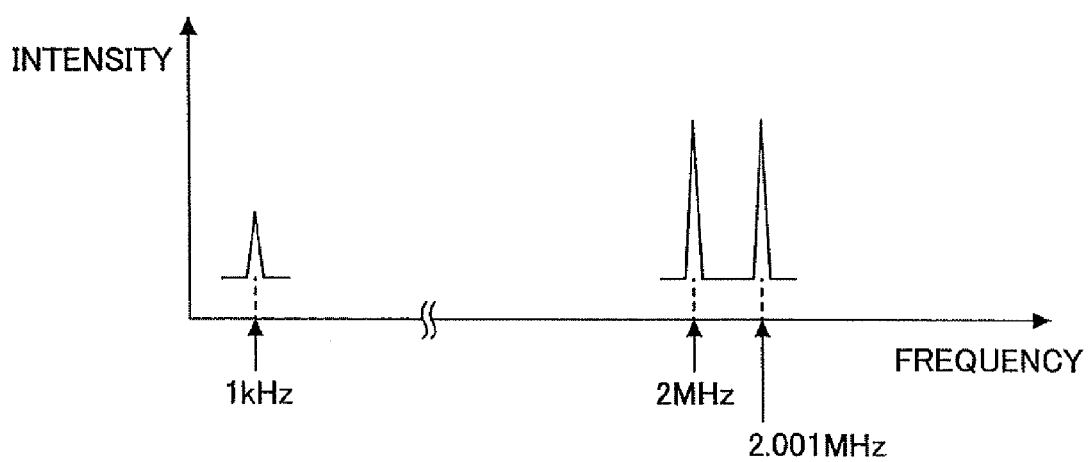
FIG. 9 is a diagram illustrating exemplary frequency components of noise generated in an output amplifier of FIG. 8.

FIG. 7 is a diagram illustrating an exemplary internal circuit configuration of the up/down control circuit 31 of FIG. 5. In FIG. 7, components identical to those in FIG. 4 are denoted by the same reference numerals, and are not further described. The following describes only the difference from the configuration shown in FIG. 4.

The configuration shown in FIG. 7 is different from the configuration shown in FIG. 4 in that an OR circuit 47 is added.

In FIG. 7, the OR circuit 47 has an input terminal that receives the limit signal LIM and the other input terminal that receives the output signal of the latch circuit 41. A signal output from the OR circuit 47 is applied to the second oscillation circuit 21 as the up control signal UPi.

According to this configuration, when the second frequency FB of the second clock signal CLKB is equal to or less than the first frequency-divided clock signal CLKA1, i.e., equal to or less the highest audible frequency, the limit signal LIM output from the third frequency divider circuit 37 is high, and hence the up control signal UP1 output from the OR circuit 47 becomes high. Therefore, the second oscillation circuit 21 operates to increase the second frequency FB, thereby preventing the second frequency FB from remaining in the audible frequency range. Note that when the limit signal LIM is high, the down signal DOWN is low, and hence the down control signal DOWNi does not become high.

In this way, when the difference between the first frequency FA and the second frequency FB falls into the audible frequency range, the oscillation frequency control circuit 23 of this embodiment changes the second frequency FB to prevent the difference between the first frequency FA and the second frequency FB from remaining in the audible frequency range, and when the second frequency FB falls into the audible frequency range, the oscillation frequency control circuit 23 increases the second frequency FB to make the second frequency FB greater than the highest audible frequency. This makes it possible to reduce clock noise superimposed on an output circuit of the digital audio circuit 2.

In the embodiment described above, the first oscillation circuit 11 is the clock source for the D/A converter 14 of the digital audio circuit 2, and the second oscillation circuit 21 is the clock source of the DC-DC converter 3 as the power supply of the audio digital circuit 2. However, the present invention is not limited to the embodiment described above and is applicable to any circuit in which a frequency difference between two oscillation circuits causes a problem.

The present application is based on Japanese Priority Application No. 2008-002272 filed on Jan. 9, 2008, with the Japanese Patent Office, the entire contents of which are hereby incorporated by reference.

The invention claimed is:

1. An oscillation frequency control circuit that controls a second oscillation circuit, which generates and outputs a second clock signal of a second frequency according to a received control signal, to control the second frequency, the oscillation frequency control circuit comprising:
   a frequency difference detection circuit unit configured to detect a difference between a predetermined first frequency of a first clock signal generated by an external first oscillation circuit and the second frequency, and generate and output an output signal indicating a detection result; and
   a frequency control circuit unit configured to control, according to the output signal of the frequency difference detection circuit unit, the second oscillation circuit to control the second frequency of the second clock signal to make an absolute value of the difference between the first frequency and the second frequency greater than a predetermined value.

2. The oscillation frequency control circuit as claimed in claim 1,
   wherein the frequency difference detection circuit unit includes:
      a first frequency divider circuit configured to divide the first clock signal into 1/N to generate and output a first frequency-divided clock signal, N being an integer greater than 1;
      a second frequency divider circuit configured to divide the second clock signal into 1/(N+1) to generate and output a second frequency-divided clock signal;
      a third frequency divider circuit configured to divide the second clock signal into 1/(N−1) to generate and output a third frequency-divided clock signal;
      a first frequency comparison circuit configured to compare a frequency of the first frequency-divided clock signal with a frequency of the second frequency-divided clock signal, and generate and output an output signal indicating a comparison result; and
      a second frequency comparison circuit configured to compare the frequency of the first frequency-divided clock signal with a frequency of the third frequency-divided clock signal, and generate and output an output signal indicating a comparison result; and
   wherein the frequency control circuit unit controls, according to the output signals of the first frequency comparison circuit and the second frequency comparison circuit, the second oscillation circuit to control the second frequency of the second clock signal to make the absolute value of the difference between the first frequency and the second frequency greater than the predetermined value.

3. The oscillation frequency control circuit as claimed in claim 2, wherein the frequency control circuit unit detects an operational state, whether the second oscillation circuit increases the second frequency or reduces the second frequency, and controls operations of the second oscillation circuit to maintain the detected operational state if the first frequency comparison circuit detects that the frequency of the second frequency-divided clock signal is less than the frequency of the first frequency-divided clock signal and the second frequency comparison circuit detects that the frequency of the third frequency-divided clock signal is greater than the frequency of the first frequency-divided clock signal.

4. The oscillation frequency control circuit as claimed in claim 3, wherein, if the first frequency comparison circuit detects that the frequency of the second frequency-divided clock signal is greater than the frequency of the first frequency-divided clock signal or if the second frequency comparison circuit detects that the frequency of the third frequency-divided clock signal is less than the frequency of the first frequency-divided clock signal, the frequency control circuit unit stops controlling the second oscillation circuit.

5. The oscillation frequency control circuit as claimed in claim 2,
   wherein the frequency difference detection circuit unit further includes
      a third frequency comparison circuit configured to compare the frequency of the first frequency-divided clock signal with the second frequency of the second clock signal, and generates and outputs an output signal indicating a comparison result; and
   wherein, if the third frequency comparison circuit detects that the second frequency of the second frequency-divided clock signal is less than the frequency of the first frequency-divided clock signal, the frequency control circuit unit causes the second oscillation circuit to increase the second frequency of the second clock signal regardless of the comparison results of the first frequency comparison circuit and the second frequency comparison circuit.

6. The oscillation frequency control circuit as claimed in claim 1, wherein the predetermined value is a highest frequency in an audible frequency range.

7. A DC-DC converter having a switching power supply circuit, the DC-DC converter comprising:
   a second oscillation circuit configured to generate and output a second clock signal of a second frequency according to a received control signal;
   a control circuit configured to perform switching control on a switch element of the switching power supply circuit according to the clock signal output from the second oscillation circuit, convert an applied voltage into a predetermined constant voltage, and output the predetermined constant voltage; and
   an oscillation frequency control circuit configured to control the second oscillation circuit to control a second frequency of the second clock signal;
   wherein the oscillation frequency control circuit includes
      a frequency difference detection circuit unit configured to detect a difference between a predetermined first frequency of a first clock signal generated by an external first oscillation circuit and the second frequency, and generate and output an output signal indicating a detection result; and
      a frequency control circuit unit configured to control, according to the output signal of the frequency difference detection circuit unit, the second oscillation circuit to control the second frequency of the second clock signal to make an absolute value of the difference between the first frequency and the second frequency greater than a predetermined value.

8. The DC-DC converter as claimed in claim 7,
   wherein the frequency difference detection circuit unit includes:
      a first frequency divider circuit configured to divide the first clock signal into 1/N to generate and output a first frequency-divided clock signal, N being an integer greater than 1;
      a second frequency divider circuit configured to divide the second clock signal into 1/(N+1) to generate and output a second frequency-divided clock signal;
      a third frequency divider circuit configured to divide the second clock signal to 1/(N−1) into generate and output a third frequency-divided clock signal;

a first frequency comparison circuit configured to compare a frequency of the first frequency-divided clock signal with a frequency of the second frequency-divided clock signal, and generate and output an output signal indicating a comparison result; and a second frequency comparison circuit configured to compare the frequency of the first frequency-divided clock signal with a frequency of the third frequency-divided clock signal, and generate and output an output signal indicating a comparison result; and wherein the frequency control circuit unit controls, according to the output signals of the first frequency comparison circuit and the second frequency comparison circuit, the second oscillation circuit to control the second frequency of the second clock signal to make the absolute value of the difference between the first frequency and the second frequency greater than the predetermined value.

9. The DC-DC converter as claimed in claim 8, wherein the frequency control circuit unit detects an operational state, whether the second oscillation circuit increases the second frequency or reduces the second frequency, and controls operations of the second oscillation circuit to maintain the detected operational state if the first frequency comparison circuit detects that the frequency of the second frequency-divided clock signal is less than the frequency of the first frequency-divided clock signal and the second frequency comparison circuit detects that the frequency of the third frequency-divided clock signal is greater than the frequency of the first frequency-divided clock signal.

10. The DC-DC converter as claimed in claim 9, wherein, if the first frequency comparison circuit detects that the frequency of the second frequency-divided clock signal is greater than the frequency of the first frequency-divided clock signal or if the second frequency comparison circuit detects that the frequency of the third frequency-divided clock signal is less than the frequency of the first frequency-divided clock signal, the frequency control circuit unit stops controlling the second oscillation circuit.

11. The DC-DC converter as claimed in claim 8,
wherein the frequency difference detection circuit unit further includes
a third frequency comparison circuit configured to compare the frequency of the first frequency-divided clock signal with the second frequency of the second clock signal, and generates and outputs an output signal indicating a comparison result; and
wherein, if the third frequency comparison circuit detects that the second frequency of the second frequency-divided clock signal is less than the frequency of the first frequency-divided clock signal, the frequency control circuit unit causes the second oscillation circuit to increase the second frequency of the second clock signal regardless of the comparison results of the first frequency comparison circuit and the second frequency comparison circuit.

12. The DC-DC converter as claimed in claim 7, wherein the predetermined value is a highest frequency in an audible frequency range.

13. The DC-DC converter as claimed in claim 7, wherein the second oscillation circuit has a frequency stability less than a frequency stability of the first oscillation circuit.

14. The DC-DC converter as claimed in claim 7, wherein the control circuit performs PFM control on the switch element.

15. A semiconductor device that includes a digital audio circuit configured to convert a received digital signal into an analog audio signal and a DC-DC converter having a switching power supply circuit, the semiconductor device comprising:

a first oscillation circuit configured to generate and output a first clock signal of a first frequency to be used for the D/A conversion;

a second oscillation circuit configured to generate and output a second clock signal of a second frequency to be used for performing switching control on a switch element of the switching power supply circuit; and an oscillation frequency control circuit configured to control the second oscillation circuit to control the second frequency of the second clock signal;

wherein the oscillation frequency control circuit includes
a frequency difference detection circuit unit configured to detect a difference between a predetermined first frequency of a first clock signal generated by an external first oscillation circuit and the second frequency, and generate and output an output signal indicating a detection result; and a frequency control circuit unit configured to control, according to the output signal of the frequency difference detection circuit unit, the second oscillation circuit to control the second frequency of the second clock signal to make an absolute value of the difference between the first frequency and the second frequency greater than a predetermined value.

16. The semiconductor device as claimed in claim 15,
wherein the frequency difference detection circuit unit includes:
a first frequency divider circuit configured to divide the first clock signal into 1/N to generate and output a first frequency-divided clock signal, N being an integer greater than 1;
a second frequency divider circuit configured to divide the second clock signal into 1/(N+1) to generate and output a second frequency-divided clock signal;
a third frequency divider circuit configured to divide the second clock signal into 1/(N−1) to generate and output a third frequency-divided clock signal;
a first frequency comparison circuit configured to compare a frequency of the first frequency-divided clock signal with a frequency of the second frequency-divided clock signal, and generate and output an output signal indicating a comparison result; and
a second frequency comparison circuit configured to compare the frequency of the first frequency-divided clock signal with a frequency of the third frequency-divided clock signal, and generate and output an output signal indicating a comparison result; and
wherein the frequency control circuit unit controls, according to the output signals of the first frequency comparison circuit and the second frequency comparison circuit, the second oscillation circuit to control the second frequency of the second clock signal to make the absolute value of the difference between the first frequency and the second frequency greater than the predetermined value.

17. The semiconductor device as claimed in claim 16, wherein the frequency control circuit unit detects an operational state, whether the second oscillation circuit increases the second frequency or reduces the second frequency, and controls operations of the second oscillation circuit to maintain the detected operational state if the first frequency comparison circuit detects that the frequency of the second frequency-divided clock signal is less than the frequency of the first frequency-divided clock signal and the second frequency comparison circuit detects that the frequency of the third frequency-divided clock signal is greater than the frequency of the first frequency-divided clock signal.

18. The semiconductor device as claimed in claim 17, wherein, if the first frequency comparison circuit detects that the frequency of the second frequency-divided clock signal is greater than the frequency of the first frequency-divided clock signal or if the second frequency comparison circuit detects that the frequency of the third frequency-divided clock signal is less than the frequency of the first frequency-divided clock signal, the frequency control circuit unit stops controlling the second oscillation circuit.

19. The semiconductor device as claimed in claim 16, wherein the frequency difference detection circuit unit further includes
a third frequency comparison circuit configured to compare the frequency of the first frequency-divided clock signal with the second frequency of the second clock signal, and generates and outputs an output signal indicating a comparison result; and wherein, if the third frequency comparison circuit detects that the second frequency of the second frequency-divided clock signal is less than the frequency of the first frequency-divided clock signal, the frequency control circuit unit causes the second oscillation circuit to increase the second frequency of the second clock signal regardless of the comparison results of the first frequency comparison circuit and the second frequency comparison circuit.

20. The semiconductor device as claimed in claim 15, wherein the predetermined value is a highest frequency in an audible frequency range.

* * * * *